United States Patent [19]

Nakamura et al.

[11] Patent Number: 4,737,728
[45] Date of Patent: Apr. 12, 1988

[54] DIGITALLY PROCESSED DEMODULATOR FOR QUADRATURE MODULATED SIGNALS

[75] Inventors: Shigeki Nakamura, Kawasaki; Makoto Ohnishi, Tokyo; Yasufumi Takahashi, Yokohama, all of Japan

[73] Assignee: Hitachi, Ltd., Tokyo, Japan

[21] Appl. No.: 15,027

[22] Filed: Feb. 17, 1987

[30] Foreign Application Priority Data

Feb. 28, 1986 [JP] Japan .................................. 61-41767
Feb. 28, 1986 [JP] Japan .................................. 61-41769

[51] Int. Cl.⁴ ............................................. H03D 3/18
[52] U.S. Cl. .................................. 329/110; 329/145; 375/82
[58] Field of Search ............... 329/110, 120, 137, 145; 375/39, 52, 57, 80, 82, 83

[56] References Cited

U.S. PATENT DOCUMENTS 4,475,219 10/1984 Puckette ............................. 375/82

OTHER PUBLICATIONS

Van Gerwin et al., "Microprocessor Implementation of High—Speed Data Modems", IEEE Trans. on Comm., Com—25, No. 2 (1977), pp. 238-250.

Primary Examiner—Eugene R. LaRoche
Assistant Examiner—Robert J. Pascal
Attorney, Agent, or Firm—Antonelli, Terry & Wands

[57] ABSTRACT

A digital demodulator for separating and demodulating quadrature modulated signals to produce the inphase components and quadrature components of a baseband through simple digital processing. This digital demodulator is constructed by an A/D converter for sampling received modulated signal so as to be converted into digital signals, means for distributing every other sample signal of the sample signals from said A/D converter into two trains of the sample signals, means for inverting the polarity of every other signal of the one signal train so as to provide the inphase components of the baseband, and means for delaying the other signal sequence by one sampling period and thereafter inverting the polarity of every other signal of the delayed signals so as to provide the quadrature components of the baseband.

4 Claims, 4 Drawing Sheets

4,737,728

DIGITALLY PROCESSED DEMODULATOR FOR QUADRATURE MODULATED SIGNALS

BACKGROUND OF THE INVENTION

This invention relates to a digital demodulator, and more particularly to a digital demodulator which demodulates original baseband signals from phase-modulated signals, removing the carrier signals contained therein, through a digital signal processing; the phase-modulated signals are generated through phase shift keying modulation (PSK) or quadrature amplitude modulation (QAM) by synthesizing a first modulated wave provided by modulating a carrier wave with one part of the original baseband signal and a second modulated wave provided by modulating another carrier wave, which has a $\pi/2$ phase difference from the above carrier wave, with another part of the original baseband signal.

A previously known dmodulator for digitally demodulating signals which are quadrature modulated through PSK, QAM, or the like is a system of passing input signals through Hilbert filters to provide two carrier wave modulated signals which have $\pi/2$ phase difference from each other, as disclosed in IEEE, Transaction on Communication, COM-25, 2, (1977) pp 238-250. In this previously known demodulator, the two carrier wave modulated signals are provided by two all-pass filters having a $\pi/2$ phase difference from each other, and accordingly, in order to perform the conversion thereof into baseband signals (demodulation), it is necessary to prepare the cosine component and the sine component of the local carrier and to perform a multiplying operation. In order to digitally perform these operations, it is necessary to write into a read-only-memory (ROM) digital signals representative of the sampled values provided by individually sampling cosine and sine components of a local carrier which have the same frequency as that of received modulated signals, and to multiply the local carrier successively read out from the ROM with received modulated signals. Therefore, a memory (ROM) having the storage capacity of the number of samples corresponding to the sampling frequency, and a multiplying circuit having a high speed operation performance must be provided.

SUMMARY OF THE INVENTION

An object of this invention is to provide a demodulator which can demodulate, through a digital circuit means, the received signals which are phase-modulated through, for example, PSK, QAM or the like and to obtain the original baseband signals.

Another object of this invention is to provide a demodulator which can demodulate received phase-shifted signals to produce the original baseband signals without using any multiplier circuit.

In order to achieve the above objects, in accordance with this invention, received quadrature modulated carrier-band signals are frequency-converted and sampled to provide digital signals. The frequency shifted and digitalized signals are divided alternately into two digital signal trains, and the inphase component (real component) is derived from one of the two digital signal trains while the quadrature component (imaginary component) is derived from the other signal train, and the base band signals are provided by inverting the polarity of every other signal.

Thus, in accordance with this invention, the baseband signals can be provided by using only means for alternately distributing the sampled digital signals one by one into two digital signal trains and means for deriving the inphase component from the one of the two digital signal trains while deriving the quadrature component from the other thereof, whereby the baseband signal can be easily demodulated or reproduced from modulated signals in a very simple circuit without using a high speed digital local oscillator for generating the local carrier and a multiplier for multiplying received signals with the local carrier.

The above and other objects, features and advantages of this invention will become more readily apparent from the following detailed description taken in conjunction with the accompanying drawings.

DESCRIPTION OF THE PREFERRED EMBODIMENTS

Figure 1:
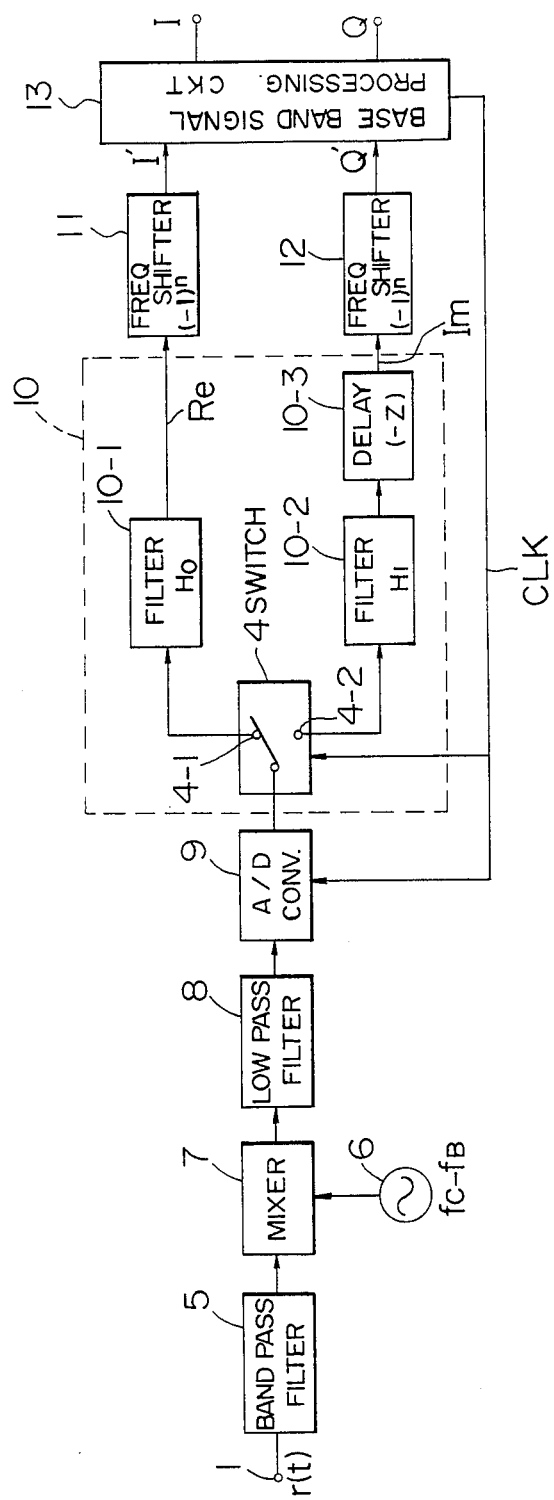
FIG. 1 is a block diagram showing the arrangement of one embodiment of the digital demodulator according to this invention.

Referring to the spectrum diagrams of FIGS. 2A to 2J, explanation will be given for the operation of one embodiment of the digital demodulator of this invention as shown in FIG. 1.

Figure 2A:
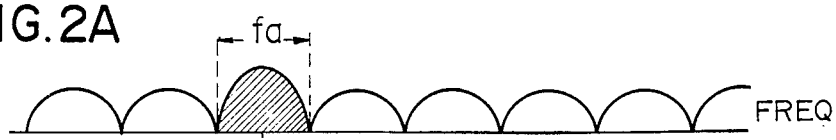
FIGS. 2A to 2J are frequency spectrum diagrams for explaining the operation of the embodiment of FIG. 1.

A received signal r(t) which is a quadrature modulated signal is applied to an input terminal 1. As well known, a quadrature modulated signal is a signal provided by phase-modulating two carrier waves having a phase difference of $\pi/2$ from each other by individual signals (an inphase component I and a quadrature component Q) and synthesizing the signals thus obtained. The spectrum of the received signals is shown in FIG. 2A wherein fc represents a carrier frequency and a shaded portion having a modulation bandwidth fa represents a desired signal to be received while the other portions are the frequency spectrum of unnecessary signals.

Figure 2B:
Figure 2C:
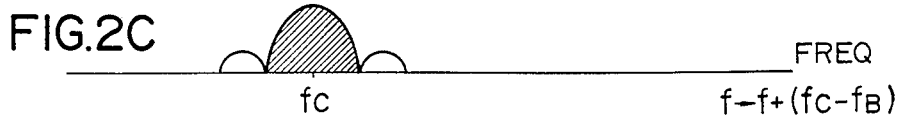

The received signal r(t) is applied to a bandpass filter 5 having a bandpass characteristic as shown in FIG. 2B, thereby providing the signals having the frequency spectrum as shown in FIG. 2C. The outputs from the bandpass filter 5 must be sufficiently attenuated at both sides of the pass bandwidth BW.

The outputs from the bandpass filter 5 are mixed with signals having a frequency of $fc - f_B$, supplied from a fixed frequency oscillator, in a mixer 7, so as to convert the central frequency thereof from fc to $fc \pm (fc - f_B)$.

Figure 2D:
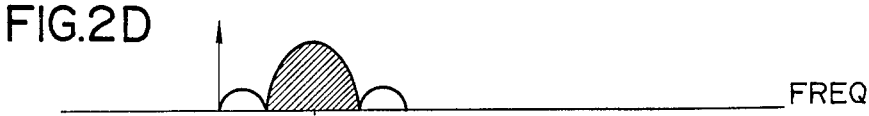

The signal thus obtained is passed through a low pass filter 8 to provide only the low sideband wave thereof, i.e. the component in the neighborhood of $f_B$, having a frequency spectrum as shown in FIG. 2D.

Figure 2E:
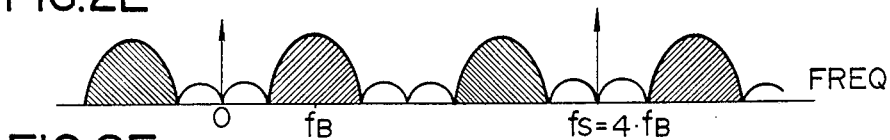

The output from the low pass filter 8 is sampled and digitized in an analog to digital (A/D) converter 9 with a sampling frequency of $4 \times nf_B$ (n: positive integer, for example n=1). The frequency spectrum of the output from the A/D converter 9 consists of a spectrum of FIG. 2D and its harmonics, as shown in FIG. 2E.

The digitized and sampled signals from the A/D converter 9 are alternately applied to waveform shaping filters 10-1 and 10-2 by a switch 4 which is switched synchronously with the sampling frequency fs. The operating frequency of these filters 10-1 and 10-2 is ½ of fs, i.e. $2f_B$. The waveform shaping filters have a roll-off characteristic to reduce the inter-symbol interference.

The output from the filter 10-2 is supplied to a delay circuit 10-3 and is further delayed by one sampling period therein.

The block 10 encircled by dotted lines acts as a filter for dividing the received signals into the inphase component (real component) and the quadrature component (imaginary component). The operational principle of such a filter will be explained in detail.

The transfer function of the filter 10 is represented by a Z transformed transfer function H(z), and the filter 10 is constructed by a digital filter which operates at a frequency equal to the above-mentioned sampling frequency $fs = 4 \times BW/2$ (the following explanation will be made assuming that $BW = 2f_B$). Assuming that the impulse response of the digital filter having a frequency characteristic as shown in FIG. 2F with the operation frequency fs is hn (nT) (where $T = 1/fs$), the transfer function H(z) is represented by $$H(z) = \sum_{n=0}^{\infty} hn \cdot Z^{-n} \quad (1)$$

Figure 2F:
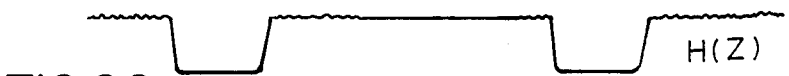
Figure 2G:
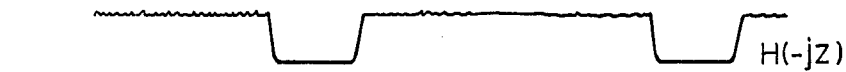

In order that the transfer function H(z) of the filter 10 passes the component in the neighborhood of $f_B$ shown in FIG. 2E, i.e. can have the frequency characteristic as shown in FIG. 2G, the pass band shown in FIG. 2F must be frequency shifted in the positive direction by $f_B$. This is identical to the replacement of f in $$Z = e^{j\omega T} = e^{j\frac{2\pi f}{fs}},$$

which results in $$e^{j\frac{2\pi(f - f_B)}{fs}} = e^{j\frac{2\pi f}{fs}} \cdot e^{-j\frac{\pi}{2}} = -j \cdot e^{j\frac{2\pi f}{fs}} = -j \cdot Z \quad (2)$$

Therefore, if this transformation is performed for the transfer function H(z), H(z) is represented as $$H(-jz) \quad (3)$$

H (−jz) can be expanded as follows.

$$\begin{aligned}
H(-jz) &= \sum_{n=0}^{\infty} hn \, (-jz)^{-n} \\
&= h_0 + h_1 (-jz)^{-1} + h_2 (-jz)^{-2} + \ldots \\
&= h_0 + h_2 (-jz)^{-2} + h_4 (-jz)^{-4} + \ldots \\
&\quad + h_1 (-jz)^{-1} + h_3 (-jz)^{-3} \\
&\quad + h_5 (-jz)^{-5} + \ldots \\
&= H_0(-z^2) + jz^{-1} H_1(-z^2)
\end{aligned} \quad (4)$$

where $H_o$ represents the terms which have even order of Z, and $H_1$ represents odd order terms.

Figure 2H:
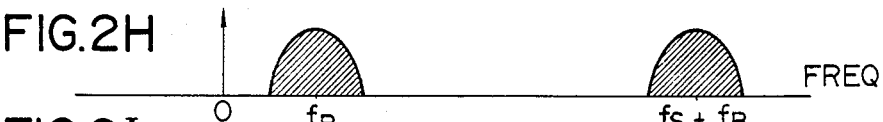

Thus, if the outputs from the A/D converter 9, which have the frequency characteristic as shown in FIG. 2E, are applied to the filter 10 having the transfer function represented by Equation (4), the A/D converter 9 produces outputs having the frequency spectrum shown in FIG. 2H.

On the other hand, the Z transform indication V(Z) of the input signals to the filter 10 can be resolved into an even progression $Ve(Z^2)$ and an odd progression $Ve(Z^2)$ as follows.

$$V(Z) = Ve(Z^2) + Z^{-1} \cdot V_o(Z^2) \quad (5)$$

Thus, the filter outputs X(z) can be written as $$\begin{aligned}
X(Z) &= V(Z) \cdot H(-jZ) \\
&= Ve(Z^2) \cdot H_o(-Z^2) + Z^{-1} \cdot V_o(Z^2) \cdot H_o(-Z^2) + \\
&\quad jZ^{-1} \cdot Ve(Z^2) \cdot H_1(-Z^2) + jZ^{-2} \cdot V_o(Z^2) \cdot H_1(-Z^2) \\
&= Xe(Z^2) + Z^{-1} X_o(Z^2)
\end{aligned} \quad (6)$$

The even progression of Equation (6) can be written as $$Xe(Z^2) = Ve(Z^2) \cdot H_o(-Z^2) + jZ^{-2} \cdot V_o(Z^2) \cdot H_1(-Z^2) \quad (7)$$

Namely, it can be represented by a real part and an imaginary part; the real part is represented by the multiplication of the signal train $Ve(Z^2)$ resampled at the sampling frequency $2f_B$ and the transfer function $H_o(-Z^2)$ operated at $2f_B$ while the imaginary part is represented by the multiplication of the signal train $V_o(Z^2)$ sampled at the sampling frequency $2 \cdot f_b$ and the transfer function $H_1(-Z^2)$ and is delayed by $Z^{-2}$. The frequency spectrum of the outputs from the filter 10 and the frequency charcteristic of the filter are such as shown in FIG. 2I and FIG. 2J, respectively.

In order to implement these characteristics through a circuit, the output from the A/D converter 9, i.e. a train of the digital signals sampled at the sampling frequency $fs = 4f_B$ is alternately distributed to the terminals 4-1 and 4-2, in synchronism with clock signals, by the switch 4, whereby the signal trains $V_e(Z^2)$ and $V_o(Z^2)$ sampled at the sampling frequency $2f_B$ are applied to the filter 10-1 having the transfer function $H_o(-Z^2)$ and the filter 10-2 having the transfer function $H_o(-Z^2)$, respectively. The output from the filter 10-2 is thereafter applied to the delay circuit 10-3.

Thus, the filter 10 outputs a complex signal consisting of $H_o(-Z^2) \cdot Ve(Z^2)$ from the filter 10-1 and $jZ^{-2} \cdot H_1(-Z^2) \cdot V_o(Z^2)$ from the delay circuit 10-3, as expressed in Equation (7).

Figure 2I:
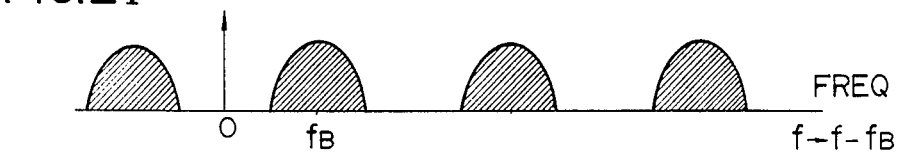
Figure 2J:

Since this complex signal has a frequency offset of $BW/2(=f_B)$ from the zero frequency as seen from FIG. 2I, it must be frequency-shifted by an amount corresponding to this frequency offset $f_B$.

This frequency shift can be performed in the same manner as in the case of shifting the pass band by $f_B$ in the positive direction as mentioned above but in this case, the sampling frequency is $2f_B$ and frequency shift is in the negative direction, i.e. by performing the following transform $$z = e^{j2\pi f/2f_B} \rightarrow e^{j2\pi (f+f_B)/2f_B} = e^{j2\pi f/f_B'}(-1) = -z \qquad (8)$$

This transformation is identical to reversing the polarity of every other sampling value by a frequency shifters 11 and 12, i.e. the processing of $(-1)^n$. Thus, the phase shifters 11 and 12 output the inphase component signals I' of the original baseband signals and the quadrature component signals Q' thereof, respectively.

These signals I' and Q' are applied to a baseband signal processing circuit 13. This processing circuit, which may be a well known circuit, performs the processings of signal discrimination, phase rotation correction, clock signal extraction and timing adjustment and finally produces the normal demodulated signals, i.e., the inphase component I of the baseband and the quadrature component Q thereof.

Figure 3:
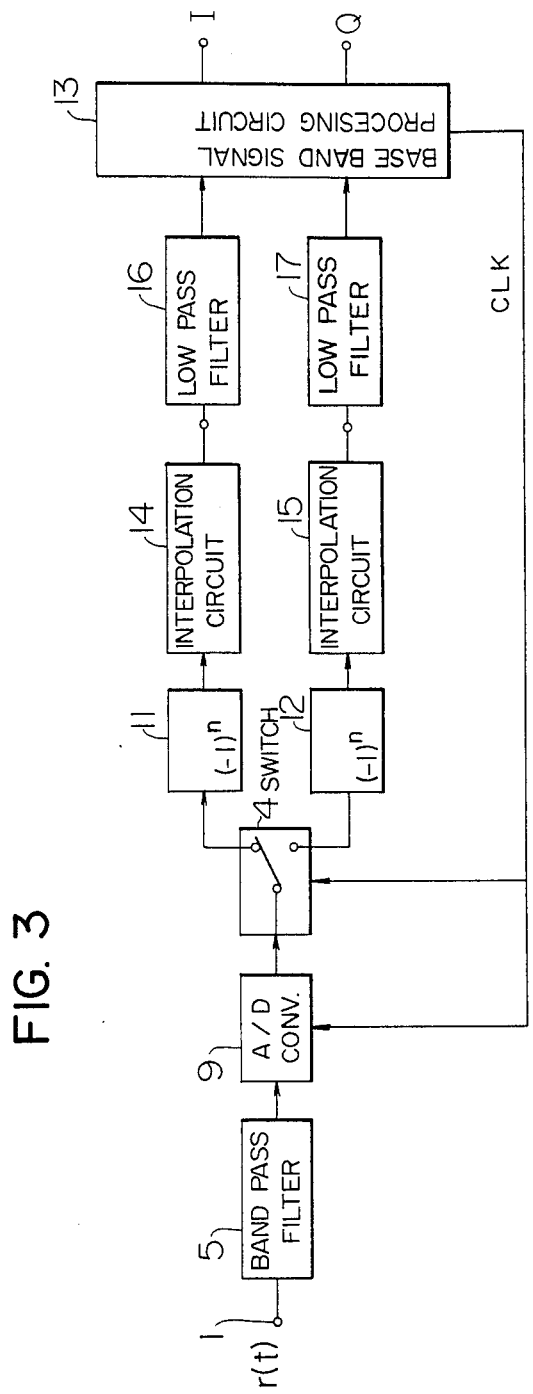
FIG. 3 is a block diagram showing the arrangement of another embodiment of the digital demodulator acording to this invention.

Now referring to FIGS. 3 and 4, another embodiment of the digital demodulator according to this invention will be explained.

In this embodiment the carrier frequency fc of the received signals has the following relation with the sampling frequency fs and the modulation bandwidth fa, i.e.

$$fc = N \cdot fs + fa$$

where fa > BW/2, and no waveform shaping filter is used. Further, in order to avoid the alias into the received signals, the sampling frequency, fs must be chosen as satisfying the following condition, $$fc + f_B/2 < N \cdot fs + fs/2 \qquad (9)$$

Figure 4A:
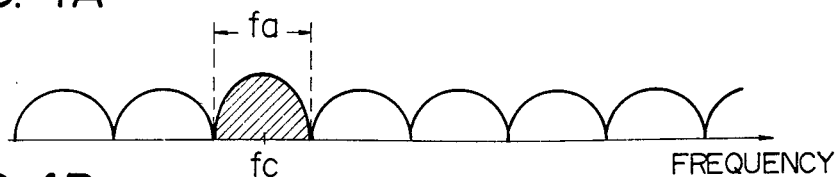
FIGS. 4A to 4E are frequency spectrum diagrams for explaining the operation of the embodiment of FIG. 3.
Figure 4B:
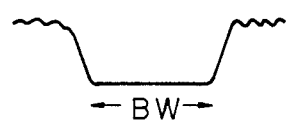
Figure 4C:
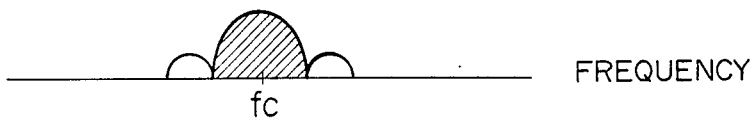

First, the received signals having such a frequency spectrum as shown in FIG. 4A is applied to the input terminal 1. The signal passes through the bandpass filter 5 having a bandpass characteristic shown in FIG. 4B to provide the signals having a frequency spectrum as shown in FIG. 4C.

Figure 4D:
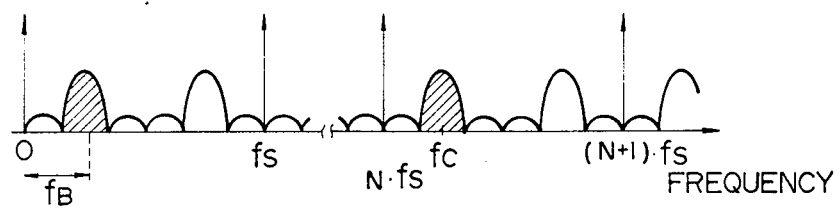

The signal from the bandpass filter 5 is sampled at the frequency fs so as to be converted into digital signal in the A/D converter 9. As mentioned above, since the relation of the carrier frequency fc with the sampling frequency fs and the modulation bandwidth fa is $$fc = N \cdot fs + fa/2$$

the frequency spectrum of the outputs from the A/D converter 9 is as shown in FIG. 4D. In this case, $fa = f_B = fs/4$.

The digitized samples from the A/D converter 9 are alternately applied to the terminals 4-1 and 4-2 by the switch 4. Thus, two trains of the discrete signals are sampled at the frequency fs/2 and phase-shifted by $\pi/2$ of the period of fs/4. These two trains of the discrete signals, however, are still the band signals with the central frequency $f_B$ so that they must be frequency-shifted by $(-f_A)$ in order to provide the corresponding baseband signals. Now considering in the Z region, $$Z = e^{j\omega T} = e^{j2\pi f/fs'} \qquad (10)$$

Since $fs' = fs/2$, is shifted by $(-f_B) = fs/4$, $$e^{j2\pi(f+fs/4)/fs/2} = e^{j2\pi(fs/4)/(fs/2)} \cdot e^{j2\pi f/fs/2} \qquad (11)$$

$$= e^{j\pi} \cdot e^{j\omega T}$$

$$= -Z$$

Figure 4E:
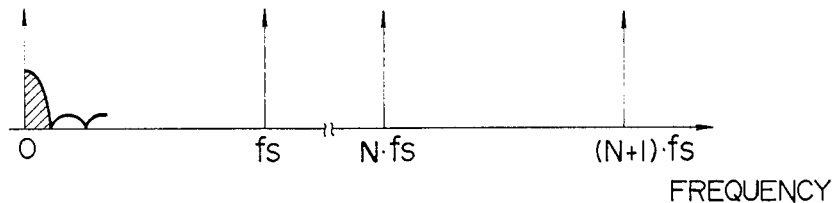

Thus, as in the embodiment of FIG. 1, the polarity of every other sampling value is reversed by the frequency shifters 11 and 12. Accordingly, the frequency shifters 11 and 12 provide two trains consisting of the inphase components of the original baseband signals and the quadrature components thereof. FIG. 4E shows the spectrum of the baseband signal whose frequency is shifted.

If the discrete period ($\frac{1}{2}f_s$) of the above inphase and quadrature components is not synchronous with the bit rate of the signals, there is no data at decision time. Therefore, the sampling values at decision time must be provided through interpolation.

Blocks 14 and 15 are the interpolation circuit to provide the sampling values through interpolation.

The low bandwidth signals of the signals frequency-shifted by $(-fa)$ are provided through the low pass filters 16 and 17, i.e., the inphase and quadrature components of the baseband signals to be demodulated are provided. These signals are applied to the baseband signal processing circuit 13 which performs the same processings as in FIG. 1. Thus, the objective baseband signals are demodulated.

In accordance with this invention, the following several effects can be provided. The quadrature modulated signals can be demodulated in a single train and using an A/D converter, a switch and two sign inverters for frequency. shifter i.e., unlike a quasi-synchronous detection, which is performed in PSK or QAM modulation, and in which there is required a local oscillator, a $\pi/2$ phase shifter and two mixers which are difficult to realize in digital circuit. Moreover, in the case of data transmission, waveform shaping filters can be constructed by two subfilters, which perform a complex filter operation and have an operation sampling frequency that is $\frac{1}{2}$ of that of an A/D converter so that the amount of processing of digital signals can be reduced and the operation frequency can be decreased. Further, by implementing all the processings of demodulation in a digital manner as mentioned before, the demodulation circuit can be constructed in a digital LSI circuit so that the circuit requires no adjustment, and allows low power consumption and the reduction of its fabrication cost. Furthermore, if a signal processor or the like is introduced in this invention, the processing for demodulation can be performed by software.

What is claimed is:

1. A digital demodulator for demodulating quadrature modulated signals, which are provided by modulating a carrier wave having inphase components and quadrature components using a baseband signal, comprising:
   an analog-to-digital converter for periodically sampling the modulated signals with a predetermined frequency and converting them into a digital signal train;
   a switch for alternately distributing each digital signal of said digital signal train from said analog-to-digital converter into a first and a second signal train;
   a first and a second frequency shifter for shifting the frequencies of said first and said second signal trains; and
   means for deriving said inphase components and said quadrature components from said first and said second frequency shifters, respectively;
   wherein the frequency of said carrier wave is an integer multiple of the sampling frequency in said A/D converter plus a frequency equal to or more than the bandwidth of said quadrature modulated signals.

2. A digital demodulator for demodulating quadrature modulated signals, which are provided by modulating a carrier wave having inphase components and quadrature components using a baseband signal, comprising:
   an analog-to-digital converter for perodically sampling the modulated signals with a predetermined frequency and converting them into a digital signal train;
   a switch for alternately distributing each digital signal of said digital signal train from said analog-to-digital converter into a first and a second signal train;
   a first and a second frequency shifter for shifting the frequencies of said first and said second signal trains; and
   means for deriving said inphase components and said quadrature components from said first and said second frequency shifters, respectively;
   wherein the frequency of said carrier wave is an integer multiple of said sampling frequency plus the frequency of ¼ of the sampling frequency in said A/D converter, and wherein said frequency shifters comprise means for inverting the polarity of every other digital signal sample in the respective first and second signal trains.

3. A digital demodulator for demodulating a received modulated signal provided by quadrature-modulating a baseband signal having an inphase component and a quadrature component, comprising:
   frequency-converting means for converting the center frequency of said received signal into a signal having a carrier frequency $f_B$ larger than said center frequency by one-half the bandwidth of said received signal;
   an A/D converter for sampling the output from said frequency converting means at a frequency of $4f_B$ so as to be converted into digital signal samples;
   separation means for alternately distributing each digital signal sample of a train of the digital signal samples from said A/D converter at said sampling frequency so as to provide a first and a second signal train;
   a first and a second filter which represent the real part and the imaginary part of one filter whose coefficients are represented by complex numbers, respectively, and which receive said first and said second signal trains, respectively;
   a delay element for delaying the outputs from said second filter by one sampling period;
   a first frequency shifter for inverting the polarity of every other digital signal sample in the signal train from said first filter;
   a second frequency shifter for inverting the polarity of every other digital signal sample in the signal train from said delay element; and
   means for deriving said inphase components and quadrature components from said first and said second frequency shifters.

4. A digital demodulator according to claim 3, wherein said first and said second filters are digital filters having a waveform shaping characteristic.

* * * * *